(12) United States Patent  (10) Patent No.: US 7,903,703 B2
Xu  (45) Date of Patent: Mar. 8, 2011

(54) CONTROL DEVICE, CONTROL CIRCUIT, CONTROL METHOD, AND RECORDING MEDIUM WITH A CONTROL PROGRAM RECORDED THEREIN

(75) Inventor: Xingzhou Xu, Tokyo (JP)

(73) Assignee: NEC Corporation, Tokyo (JP)

( * ) Notice: Subject to any disclaimer, the term of this patent is extended or adjusted under 35 U.S.C. 154(b) by 484 days.

(21) Appl. No.: 12/048,074

(22) Filed: Mar. 13, 2008

(65) Prior Publication Data

US 2008/0224744 A1 Sep. 18, 2008

(30) Foreign Application Priority Data

Mar. 15, 2007 (JP) .................... 2007-067435

(51) Int. Cl.
  *H01S 3/13* (2006.01)
  *H01S 3/00* (2006.01)
(52) U.S. Cl. .................... 372/29.01; 372/38.1
(58) Field of Classification Search ........... 372/29.01, 372/29.011, 38.1, 38.01
  See application file for complete search history.

(56) References Cited

U.S. PATENT DOCUMENTS

2005/0111504 A1* 5/2005 Nishikawa et al. ........ 372/38.01
2008/0007182 A1* 1/2008 Deurenberg et al. ......... 315/149

FOREIGN PATENT DOCUMENTS

| JP | 2003069142 A | 3/2003 |
| JP | 2003264339 A | 9/2003 |
| JP | 2004153176 A | 5/2004 |
| JP | 2005031888 A | 2/2005 |

* cited by examiner

*Primary Examiner* — Armando Rodriguez

(57) ABSTRACT

The present invention provides a control device capable of performing feedback control so that a signal-wavelength input to a control target object becomes a specific signal-wavelength, using an input signal whose duty value is other than 50%. Accordingly, the control device according to the present invention is a control device for performing feedback control so that a signal-wavelength input to a control target object (500) becomes a specific signal-wavelength, the control device including a control unit (100) that performs feedback control so that the signal-wavelength input to the control target object (500) becomes the specific signal-wavelength, using an input signal input to the control target object (500), the input signal whose duty value is other than 50%.

12 Claims, 5 Drawing Sheets

FIG. 2

| | PRESENT WAVELENGTH: λ | DUTY VALUE OF MONITOR SIGNAL |
|---|---|---|
| (a) | λ < λ0 | 1−D |
| (b) | λ = λ0 | 0 |
| (c) | λ > λ0 | D |

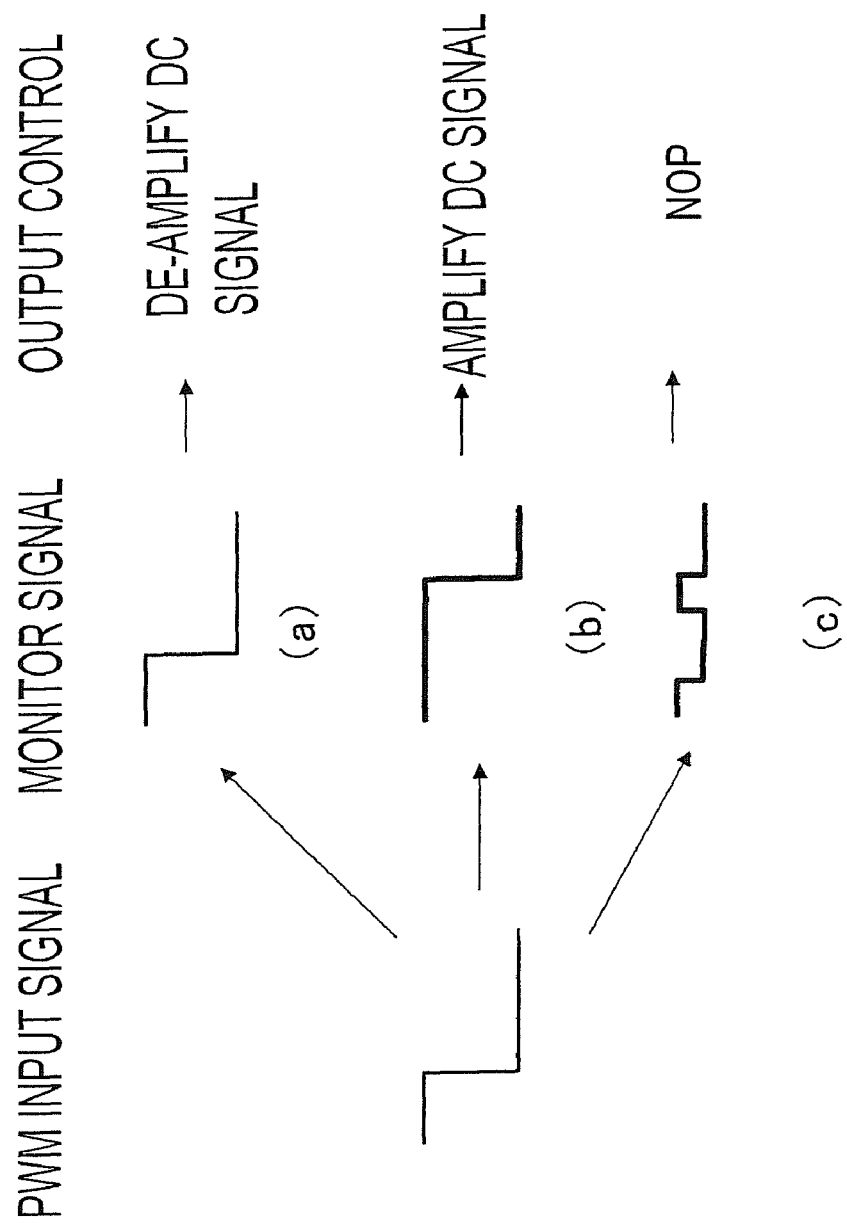

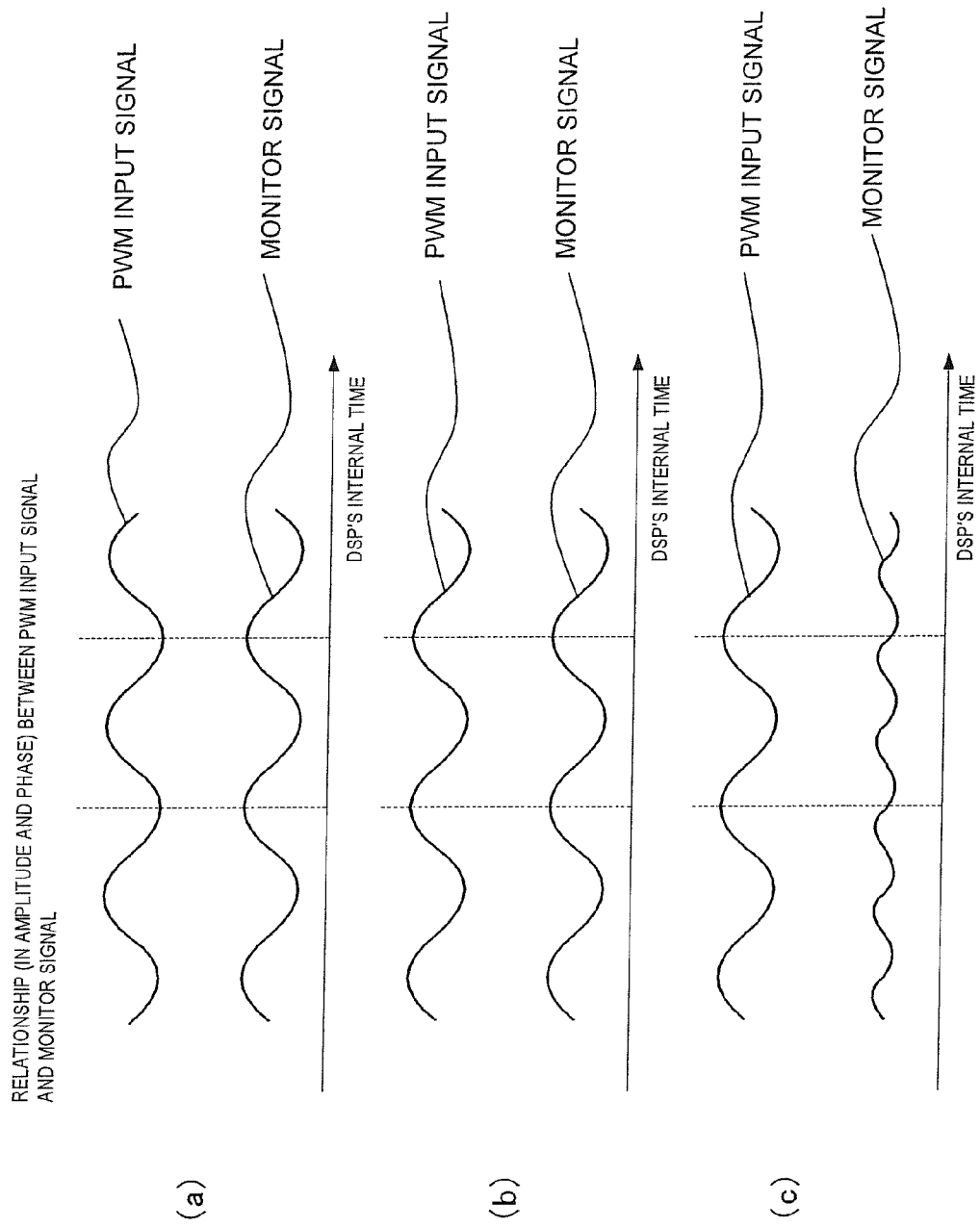

CONTROL DEVICE, CONTROL CIRCUIT, CONTROL METHOD, AND RECORDING MEDIUM WITH A CONTROL PROGRAM RECORDED THEREIN

This application is based upon and claims the benefit of priority from Japanese paten application No. 2007-067435, filed on Mar. 15, 2007, the disclosure of which is incorporated herein in its entirety by reference.

BACKGROUND OF THE INVENTION

1. Field of the Invention

The present invention relates to a control device, a control circuit, a control method, and a recording medium with a control program recorded therein, and specifically relates to a control device, a control circuit, a control method, and a recording medium with a control program recorded therein, which are capable of performing feedback control to reach an optimum lock point using an input signal whose duty value is other than 50%.

2. Description of Related Art

In recent years, in the course of enhancing the speed, integration density and performance of embedded control, it has become common to request one processor to perform multitasking.

Also, concurrently, hardware technology for including a processor and many peripheral devices in one chip has made substantial progress.

In order to provide higher-performance, low-cost control, optimization of the balance between the software (firmware) portion and the hardware portion is becoming increasingly important.

The feedback control to reach an optimum lock point has been performed using a dither signal with a duty value of 50%, so it has been necessary to accurately detect a phase shift caused within the control target by performing synchronous processing of a dither signal and a monitor signal within a DSP (Digital Signal Processor).

Accordingly, the current state is that the control circuits and the processors firmware have become complicated.

In view of this state, it is considered to be necessary to develop a control method for reducing the complexity of the control circuits and the processors firmware.

The technical documents filed for patent applications prior to the filing of the patent application for the present invention include documents each disclosing a semiconductor laser module capable of performing stable and high-accurate wavelength locking even when the temperature changes greatly (See, e.g., Japanese Patent Laid Open Publication No. 2003-264339).

They also include documents each disclosing a technology capable of precisely detecting a shift of the wavelength of light from a light source by disposing a first photo-detecting element, an etalon and a second photo-detecting element in this order and introducing light transmitted through the first photo-detecting element to the etalon (see, e.g., Japanese Patent Laid Open Publication No. 2003-69142).

Furthermore, they include documents each disclosing a technology that controls the temperature of an etalon element with high accuracy to avoid any influence from external temperature changes (see, e.g., Japanese Patent Laid Open Publication No. 2004-153176).

Furthermore, they include documents disclosing a technology for reliably finding a saddle point by: providing a path connecting two given local minimum points; and providing the present point, i.e., an attention point on the path to judge whether or not the attention point is on the boundary; if it is on the boundary, creating that point as a boundary point, thereby creating a boundary point; searching for a local minimum point of the intended function on the boundary composed by the created points; and when the local minimum point is found, outputting that point as a saddle point (see, e.g., Japanese Patent Laid Open Publication No. 2005-31888).

However, Japanese Patent Laid Open Publication Nos. 2003-264339, 2003-69142, 2004-153176, and 2005-31888 mentioned above include no descriptions or suggestions of necessity of performing feedback control so that a signal-wavelength input to a control target object becomes a specific signal-wavelength, using an input signal whose duty value is other than 50%.

SUMMARY OF THE INVENTION

The present invention has been made in view of the above circumstances, and an object of the present invention is to provide a control device, a control circuit, a control method and a recording medium with a control program recorded therein, which are capable of performing feedback control so that a signal-wavelength input to a control target object becomes a specific signal-wavelength, using an input signal whose duty value is other than 50%.

<Control Device>

A control device according to the present invention provides a control device for performing feedback control so that a signal-wavelength input to a control target object becomes a specific signal-wavelength, the control device comprising a control unit that performs feedback control so that the signal-wavelength input to the control target object becomes the specific signal-wavelength, using an input signal input to the control target object, the input signal whose duty value is other than 50%.

<Control Circuit>

Also, a control circuit according to the present invention provides a control circuit for performing feedback control so that a signal-wavelength input to a control target object becomes a specific signal-wavelength, the control circuit comprising a control unit that performs feedback control so that the signal-wavelength becomes the specific signal-wavelength, using an input signal whose duty value is other than 50%.

<Control Method>

Also, a control method according to the present invention provides a control method performed by a control device that performs feedback control so that a signal-wavelength input to a control target object becomes a specific signal-wavelength, the method comprising a control step of performing feedback control with the control device so that the signal-wavelength becomes the specific signal-wavelength, using an input signal whose duty value is other than 50%.

<Recording Medium with a Control Program Recorded Therein>

Also, a recording medium with a control program recorded therein according to the present invention provides a recording medium with a control program recorded therein, the control program being executed by a control device that performs feedback control so that a signal-wavelength input to a control target object becomes a specific signal-wavelength, the recording medium making the control device execute control processing for performing feedback control so that the signal-wavelength becomes the specific signal-wavelength, using an input signal whose duty value is other than 50%.

BRIEF DESCRIPTION OF THE DRAWINGS

The objects and features of the present invention will become more apparent from the consideration of the following detailed description taken in conjunction with the accompanying drawings, in which:

FIG. 2 is a diagram indicating a relationship between a present wavelength λ and a duty value of a monitor signal;

FIG. 4 shows diagrams each illustrating a method for controlling a DC signal output to a DAC (200); and FIG. 5 is a diagram indicating a relationship (in amplitude and phase) between a PWM input signal and a monitor signal, which is related to the present invention.

EXEMPLARY EMBODIMENT

<Overview of Control Device (Control Circuit)>

First, an overview of a control device (control circuit) according to an exemplary embodiment of the present invention will be described with reference to FIG. 3.

A control device (control circuit) according to the present embodiment is a control device (control circuit) that performs feedback control so that a signal-wavelength input to a control target object (corresponding to an LD module 500) becomes a specific signal-wavelength.

The control device (control circuit) includes a control unit (corresponding to a DSP 100) that performs feedback control so that the signal-wavelength input to the control target object (500) becomes the specific signal-wavelength, using an input signal input to the control target object (500), the input signal whose duty value is other than 50%.

As a result, it becomes possible to perform feedback control so that a signal-wavelength input to the control target object (500) becomes a specific signal-wavelength, using an input signal whose duty value is other than 50%. Hereinafter, a control device (control circuit) according to the present embodiment will be described with reference to the attached drawings.

Figure 1:
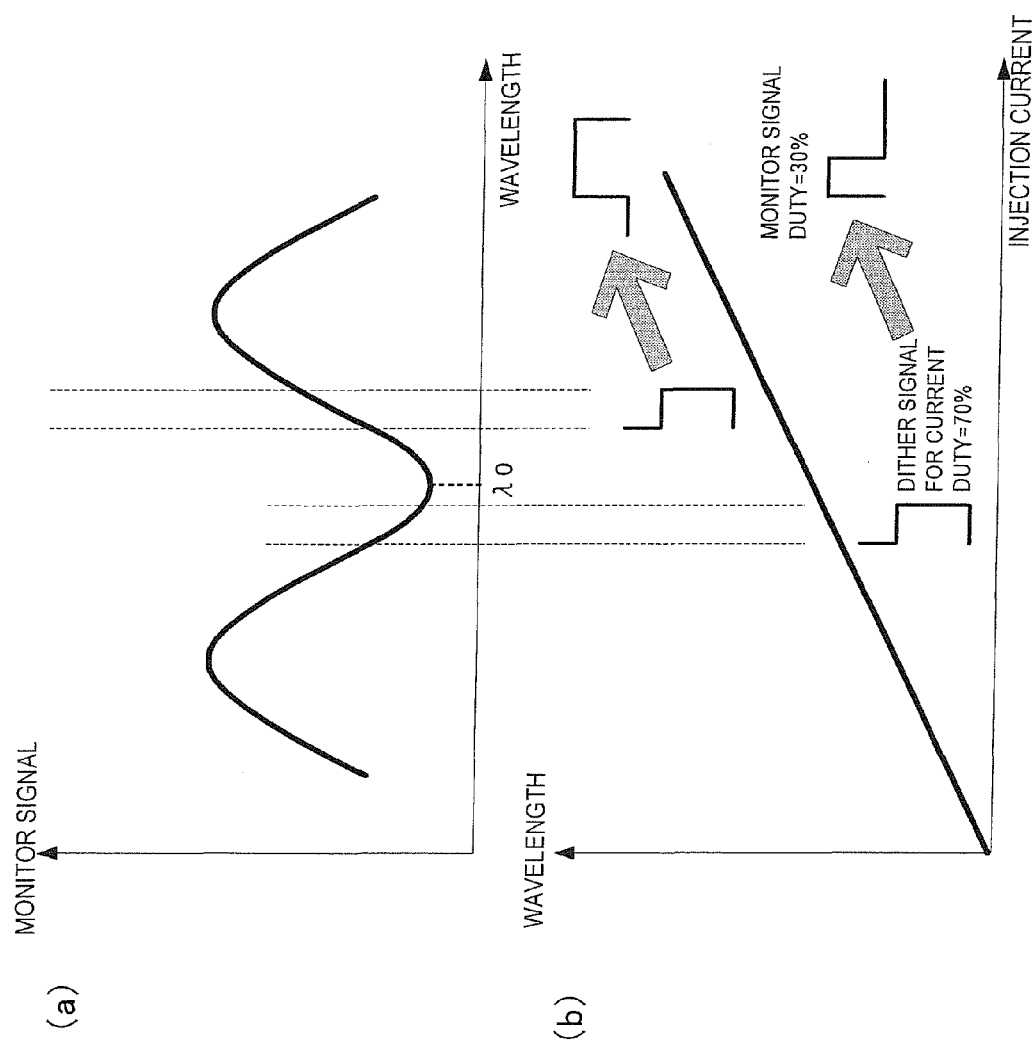
FIG. 1 shows diagrams illustrating a periodic wavelength characteristic: (A) indicates a relationship between a monitor signal and a wavelength; and (B) indicates a relationship between a wavelength and injection current.

Currently, as shown in FIG. 1(A), a device with a periodic wavelength characteristic has been under development.

As shown in FIG. 1(B), since a laser wavelength has the characteristic of being proportional to specific injection current, when the injection current is subjected to AM (in amplitude modulation) by means of a square wave as shown in FIG. 1(B), square wave components will appear also in a monitor signal that can be obtained by monitoring the laser. FIG. 1(A) is a diagram indicating a relationship between a monitor signal and a wavelength, and FIG. 1(B) is a diagram indicating a relationship between a wavelength and injection current.

When a wavelength λ0, which is located at the bottom of the curve shown in FIG. 1(A), is determined to be a lock target, it is necessary to know whether the present wavelength λ (i.e., injection current amount) is shorter or longer than the lock target wavelength λ0.

Accordingly, when a dither square wave whose duty value is other than 50% is used, monitoring as shown in FIG. 2 can be performed. Here, the duty value of the dither signal is D. FIG. 2 indicates the relationship between the present wavelength λ and the duty value of the monitor signal.

As shown in FIG. 2(A), if the present wavelength λ is shorter than the lock target wavelength λ0 (λ<λ0), the duty value of the monitor signal is "1-D".

Furthermore, as shown in FIG. 2(B), if the present wavelength λ is equal to the lock target wavelength λ0 (λ=λ0), the duty value of the monitor signal is "0".

Furthermore, as shown in FIG. 2(C), if the present wavelength λ is longer than the lock target wavelength λ0 (λ>λ0), the duty value of the monitor signal is "D".

The control device (control circuit) according to the present embodiment makes it possible to easily perform the control for locking the above-mentioned present wavelength λ (i.e., injection current amount) shown in FIG. 2 at the lock target wavelength λ0 by performing the feedback control of the present wavelength λ using the relationship between the present wavelength λ and the duty value of the monitor signal. Hereinafter, the control for locking at a specific wavelength λ0 for an optical communication laser will be described with reference to FIG. 3.

First, the configuration of the control device (control circuit) according to the present embodiment will be described with reference to FIG. 3. FIG. 3 is a block diagram illustrating the configuration of the control device (control circuit) according to the present embodiment.

The control device (control circuit) according to the present embodiment includes a DSP (Digital Signal Processor) (100), a DAC (Digital Analog Converter) (200), an adder circuit (300), a drive circuit (400), an LD module (500), and a monitor circuit (600).

The DSP (100) in the present embodiment includes a PWM (Pulse Wide Modulation) port (101), and an ADC (Analog Digital Converter) (102).

Figure 3:
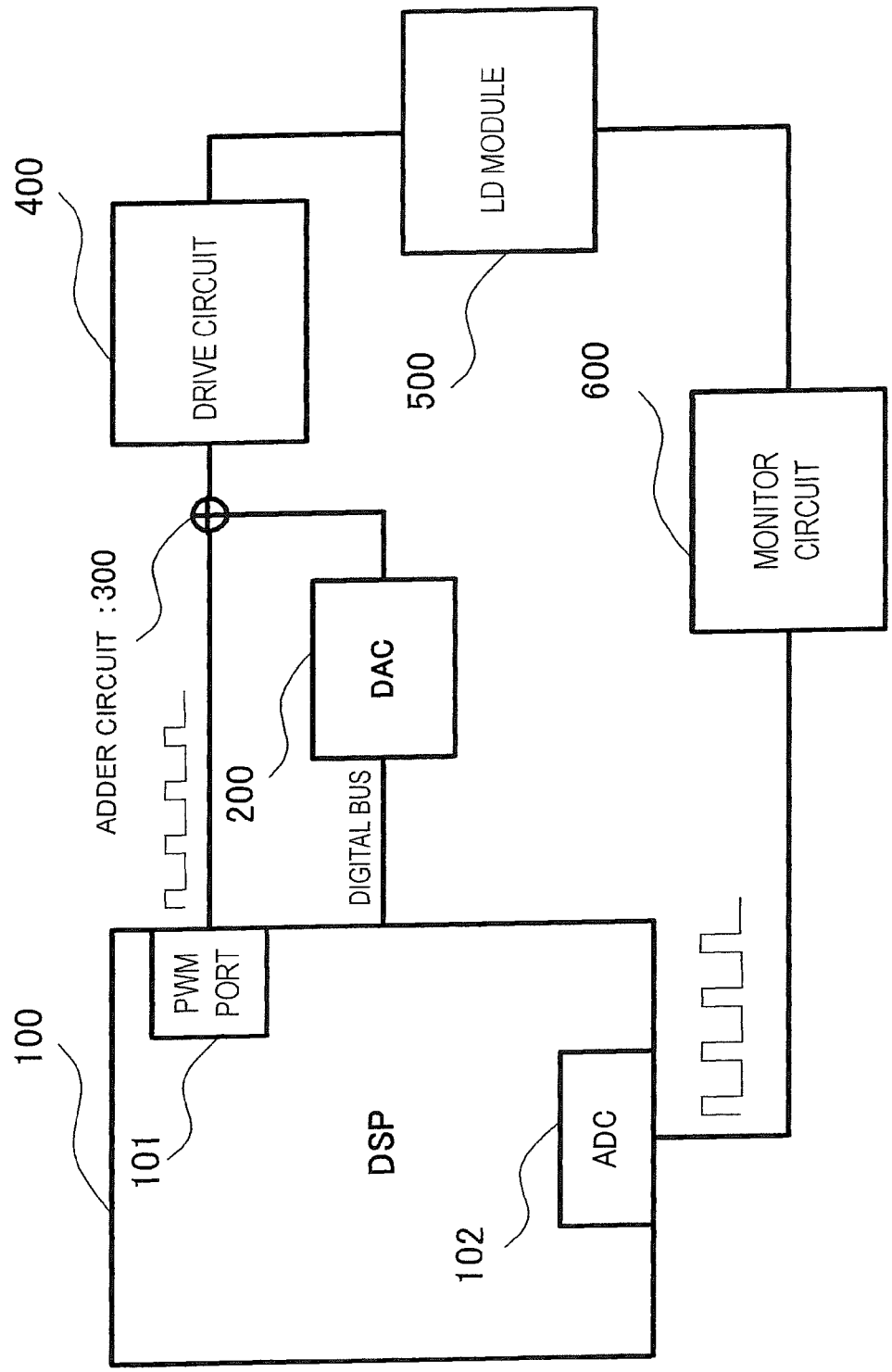
FIG. 3 is a block diagram illustrating a configuration of a control device (control circuit) according to an exemplary embodiment of the present invention.

The DSP (100) incorporating the PWM port (101) and the ADC (102), which is now becoming popular, can easily provide the control for locking at the specific wavelength λ0 using the control device (control circuit) shown in FIG. 3.

First, the DSP (100) outputs a DC (direct current) signal to the DAC (200) via a digital bus.

Also, the DSP (100) is set so as to generate a PWM (Pulse Wide Modulation) signal whose duty value is other than 50% (basic frequency f0, D=30%) within the DSP (100). The PWM signal is output to the PWM port (101) to the adder circuit (300).

The DAC (200) coverts the DC signal input from the DSP (100) to an analog signal, and outputs the converted analog signal to the adder circuit (300).

The adder circuit (300) adds the PWM signal input from the PWM port (101) and the analog signal input from the DAC (200), and outputs the added signal to the drive circuit (400).

The drive circuit (400) performs voltage-to-current conversion based on a signal input from the voltage adder circuit (300), and performs AM (Amplitude Modulation) of the injection current for controlling the LD module (500). The drive circuit (400) outputs the amplitude-modulated signal to the LD module (500).

The LD module (500) emits light based on the signal input from the drive circuit (400).

The monitor circuit (600) monitors the LD module (500), and generates a monitor signal. Then, the monitor circuit (600) extracts the AC components of the monitor signal, performs level conversion processing, and outputs the monitor signal to the ADC (102) in the DSP (100).

The DSP (100) samples the monitor signal at a frequency of no less than 10×f0.

As a result, the DSP (100) can obtain no less than 10 sample signals for one period of the monitor signal. The DSP (100)

divides the sample signals obtained from the monitor signal to LOW and HIGH, and the percentage of the HIGH sample signals is set to be the duty value of the monitor signal. For example, when the percentage of the HIGH sample signals is 70%, the duty value of the monitor signal is set to be 70%.

The DSP (100) calculates the relationship between the present wavelength λ at the drive circuit (400) and the lock target wavelength λ0 based on the duty value of the monitor signal and the relationship shown in FIG. 2, and controls the DC signal output to the DAC (200) according to the relationship as shown in FIG. 4, and performs feedback control so that the present wavelength λ at the drive circuit (400) and the lock target wavelength λ0 correspond to each other.

For example, as shown in FIG. 4(A), the case where the duty value of the monitor signal is the same (D) as the duty value of the PWM signal output from the PWM port (101) falls under FIG. 2(C), and in that case, the DSP (100) determines that the present wavelength λ at the drive circuit (400) is longer than the lock target wavelength λ0, and performs output control so as to de-amplify the DC signal output to the DAC (200). The de-amplification value for de-amplifying the DC signal is not specifically limited and any value can be employed to output control so as to de-amplify the DC signal.

Also, as shown in FIG. 4(B), the case where the duty value of the monitor signal is a value of 1 minus the duty value of the PWM signal output from the PWM port (101) (1-D) falls under FIG. 2(A), and in that case, the DSP (100) determines that the present wavelength λ at the drive circuit (400) is shorter than the lock target wavelength λ0, and performs output control so as to amplify the DC signal output to the DAC (200). The amplification value for amplifying the DC signal is not specifically limited, and any value can be employed to output control so as to amplify the DC signal.

Also, as shown in FIG. 4(C), the case where the duty value of the monitor signal is 0 falls under FIG. 2(B), the DSP (100) determines that the present wavelength λ at the drive circuit (400) is equal to the lock target wavelength λ0, and performs output control so as not to change the DC signal output to the DAC (200) (NOP: No Operation).

In a control circuit related to the present invention, as shown in FIG. 5, since control for locking at a lock target wavelength λ0 has been performed using a dither signal with a duty value of 50%, it has been necessary to accurately detect a phase shift caused within the control target by performing synchronous processing on the dither signal and the monitor signal within the DSP.

Accordingly, the control circuit related to the present invention has complicated processor firmware. FIG. 5 shows diagrams each indicating the relationship (amplitude and phase) between a "PWM INPUT SIGNAL" and a "MONITOR SIGNAL": FIG. 5(A) shows a state in which the phase of the PWM input signal and that of the monitor signal are shifted from each other; FIG. 5(B) shows a state in which the phase of the PWM input signal and that of the monitor signal correspond to each other; and FIG. 5(C) shows a state in which the phase and amplitude of the PWM input signal and those of the monitor signal are shifted from each other.

Meanwhile, in the control device (control circuit) according to the present embodiment, the DSP (100) can perform control for locking at the lock target wavelength λ0 using the above-described algorithm shown in FIG. 4 by means of detecting the duty value of the monitor signal alone, without synchronizing the dither signal and the monitor signal. As a result, the control device (control circuit) according to the present embodiment reduce a load of firmware processing, making it possible to reduce the complexity of the processor firmware.

As described above, the control device (control circuit) according to the present embodiment can eliminate phase detection processing, which has been essential in the control methods related to the present invention, by monitoring the LD module (500), which is the control target object, and generating a monitor signal, and then sampling the generated monitor signal, calculating the duty value of the monitor signal based on the sampled sampling signal, comparing the calculated duty value of the monitor signal and the duty value of the PWM input signal, obtaining the relationship between the present wavelength λ of the drive circuit (400) and the lock target wavelength λ0 based on the relationship shown in FIG. 2, and controlling the DC signal for controlling the LD module (500) according to the relationship. Accordingly, the control device (control circuit) according to the present embodiment can reduce a load of firmware processing.

The above-described embodiment is a preferable embodiment of the present invention, and is not one that limits the scope of the present invention to the embodiment only, and various modifications thereof can be carried out as far as they do not deviate from the spirit of the present invention.

For example, the control operation performed by the control device (control circuit) in the above-described embodiment can be carried out in the form of not hardware structure, but software such as a computer program, and the above-described control operation can be executed in the control device (control circuit) by recording the above program on an optical recording medium, a magnetic recording medium, a magneto optical recording medium, or a recording medium such as semiconductor, and reading the program from the recording medium into the control device (control circuit). Also, the above control operation can be executed in the control device (control circuit) by reading the program from an external device connected via a predetermined network into the control device (control circuit).

The present invention can be employed in any device that can perform feedback control to reach an optimum lock point.

What is claimed is:

1. A control device for performing feedback control so that a signal-wavelength input to a control target object becomes a specific signal-wavelength, the control device comprising a control unit that performs feedback control so that the signal-wavelength input to the control target object becomes the specific signal-wavelength, using an input signal input to the control target object, the input signal whose duty value is other than 50%, wherein the control unit compares a duty value of a monitor signal for the control target object and the duty value of the input signal input to the control target object, performs output control according to the comparison result, and performs feedback control so that the signal-wavelength input to the control target object becomes the specific signal-wavelength.

2. The control device according to claim 1, wherein:
the control target object is a light source that emits light;
the control device includes a drive unit that controls and drives the light source;
the input signal is a PWM signal;
the control unit outputs the PWM signal and a DC signal to the drive unit to control the drive unit;
if the duty value of the monitor signal is equal to the duty value of the input signal, the control unit performs output control of the DC signal so as to de-amplify the DC signal output to the drive unit;
if the duty value of the monitor signal is a value of 1 minus the duty value of the input signal, the control unit performs output control of the DC signal so as to amplify the DC signal output to the drive unit; and if the duty value of the monitor signal is 0, the control unit performs output control of the DC signal so as not to change the DC signal output to the drive unit.

3. The control device according to claim 1, wherein the control unit samples the monitor signal, and calculates the duty value of the monitor signal based on the sampled signal.

4. A control circuit for performing feedback control so that a signal-wavelength input to a control target object becomes a specific signal-wavelength, the control circuit comprising a control unit that performs feedback control so that the signal-wavelength becomes the specific signal-wavelength, using an input signal whose duty value is other than 50%, wherein the control unit compares a duty value of a monitor signal for the control target object and the duty value of the input signal input to the control target object, performs output control according to the comparison result, and performs feedback control so that the signal-wavelength input to the control target object becomes the specific signal-wavelength.

5. The control circuit according to claim 4, wherein:
the control target object is a light source that emits light;
the control circuit includes a drive unit that controls and drives the light source;
the input signal is a PWM signal;
the control unit outputs the PWM signal and a DC signal to the drive unit to control the drive unit;
if the duty value of the monitor signal is equal to the duty value of the input signal, the control unit performs output control of the DC signal so as to de-amplify the DC signal output to the drive unit;
if the duty value of the monitor signal is a value of 1 minus the duty value of the input signal, the control unit performs output control of the DC signal so as to amplify the DC signal output to the drive unit; and
if the duty value of the monitor signal is 0, the control unit performs output control of the DC signal so as not to change the DC signal output to the drive unit.

6. The control circuit according to claim 4, wherein the control unit samples the monitor signal, and calculates the duty value of the monitor signal based on the sampled signal.

7. A control method performed by a control device that performs feedback control so that a signal-wavelength input to a control target object becomes a specific signal-wavelength, the method comprising a control step of performing feedback control with the control device so that the signal-wavelength becomes the specific signal-wavelength, using an input signal whose duty value is other than 50%, wherein the control step includes comparing a duty value of a monitor signal for the control target object and the duty value of the input signal input to the control target object, performing output control according to the comparison result, and performing feedback control so that the signal-wavelength input to the control target object becomes the specific signal-wavelength.

8. The control method according to claim 7, wherein:
the control target object is a light source that emits light;
the control device includes a drive unit that controls and drives the light source;
the input signal is a PWM signal;
the control step includes outputting the PWM signal and a DC signal to the drive unit to control the drive unit; and
the control step further includes
performing output control of the DC signal so as to de-amplify the DC signal output to the drive unit, if the duty value of the monitor signal is equal to the duty value of the input signal;
performing output control of the DC signal so as to amplify the DC signal output to the drive unit, if the duty value of the monitor signal is a value of 1 minus the duty value of the input signal; and
performing output control of the DC signal so as not to change the DC signal output to the drive unit, if the duty value of the monitor signal is 0.

9. The control method according to claim 7, wherein the control step further includes sampling the monitor signal, and calculating the duty value of the monitor signal based on the sampled signal.

10. A recording medium with a control program recorded therein, the control program being executed by a control device that performs feedback control so that a signal-wavelength input to a control target object becomes a specific signal-wavelength, the recording medium making the control device execute control processing for performing feedback control so that the signal-wavelength becomes the specific signal-wavelength, using an input signal whose duty value is other than 50%, wherein the control processing includes comparing a duty value of a monitor signal for the control target object and the duty value of the input signal input to the control target object, performing output control according to the comparison result, and performing feedback control so that the signal-wavelength input to the control target object becomes the specific signal-wavelength.

11. The recording medium according to claim 10, wherein:
the control target object is a light source that emits light;
the control device includes a drive unit that controls and drives the light source;
the input signal is a PWM signal;
the control processing includes outputting the PWM signal and a DC signal to the drive unit to control the drive unit; and
the control processing further includes
performing output control of the DC signal so as to de-amplify the DC signal output to the drive unit, if the duty value of the monitor signal is equal to the duty value of the input signal;
performing output control of the DC signal so as to amplify the DC signal output to the drive unit, if the duty value of the monitor signal is a value of 1 minus the duty value of the input signal; and
performing output control of the DC signal so as not to change the DC signal output to the drive unit, if the duty value of the monitor signal is 0.

12. The recording medium according to claim 10, wherein the control processing further includes sampling the monitor signal, and calculating the duty value of the monitor signal based on the sampled signal.

* * * * *